United States Patent [19]

Nakamura et al.

[11] 4,433,243
[45] Feb. 21, 1984

[54] ELECTRON BEAM EXPOSURE APPARATUS

[75] Inventors: Kazumitsu Nakamura, Katsuta; Masaru Miyazaki, Ome, both of Japan

[73] Assignee: Hitachi, Ltd., Tokyo, Japan

[21] Appl. No.: 288,451

[22] Filed: Jul. 30, 1981

[30] Foreign Application Priority Data

Aug. 1, 1980 [JP] Japan ............................. 55-105017

[51] Int. Cl.³ ................... G01K 1/08; B23K 15/00
[52] U.S. Cl. .................... 250/397; 250/491.1; 219/121 EY
[58] Field of Search .................. 219/121 EA, 121 EY; 250/491, 492.2, 398, 397

[56] References Cited

U.S. PATENT DOCUMENTS

| | | | |
|---|---|---|---|
| 3,308,264 | 3/1967 | Ullery | 219/121 EY |
| 3,413,517 | 11/1968 | Barber et al. | 250/492.2 |
| 3,513,285 | 5/1970 | Imura | 219/121 EY |
| 4,317,981 | 3/1982 | Chubarou | 219/121 EA |

*Primary Examiner*—Bruce C. Anderson
*Attorney, Agent, or Firm*—Antonelli, Terry & Wands

[57] ABSTRACT

With the invention an electron beam scans reference marks formed on a sample so as to determine the positions of the reference marks. The sample is scanned by the electron beam with respect to the positions of the reference marks thereby to form a desired pattern on the sample. The accelerating voltage for the electron beam is changed to a lower value upon scanning the sample for generation of a pattern than upon scanning the reference marks.

10 Claims, 5 Drawing Figures

ELECTRON BEAM EXPOSURE APPARATUS

BACKGROUND OF THE INVENTION

This invention relates to electron beam exposure apparatus, and particularly to an electron beam exposure apparatus for forming a predetermined pattern on a sample with respect to the positions of the reference marks formed on the sample.

In the electron beam exposure apparatus, the sample is scanned by the electron beam to have a predetermined pattern formed. The formation of a pattern is generally performed with respect to the positions of the reference marks which are determined by scanning the reference marks by the electron beam.

The positions of the reference marks are often determined by use of secondary electron signals which are obtained from the reference marks when the reference marks are scanned by the electron beam. However, these signals are generally weak and have a S/N ratio reduced with a passage of time.

This problem can be solved by increasing the energy of the electron beam because the secondary electron signal intensity increases as the energy of the electron beam rises. Although the energy of the electron beam is increased by raising the accelerating voltage of electron beam, the increase of the intensity of the reference mark detection signals, in the normal electron beam exposure apparatus, will widen the width of the pattern, thus making high-precision patterning difficult.

SUMMARY OF THE INVENTION

It is an object of the present invention to provide an electron beam exposure apparatus capable of preventing the widening of the width of the pattern even though the intensity of the reference mark detection signals is increased.

In accordance with the invention, the energy of the electron beam is changed to a higher value upon scanning of the reference marks by the electron beam than upon scanning the sample for making a pattern.

Other objects and features of the invention will be understood from the description with reference to the accompanying drawings.

DESCRIPTION OF THE PREFERRED EMBODIMENTS

Figure 1:
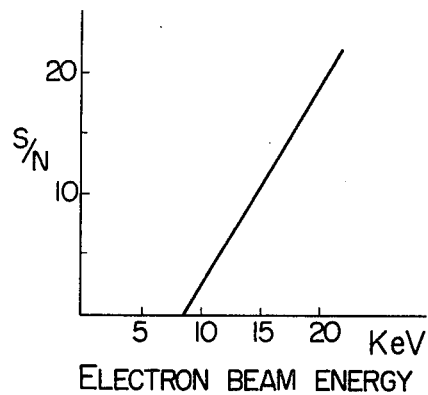
FIG. 1 is a graph of the energy of the electron beam vs. the S/N ratio of secondary electron beam detection signals.

FIG. 1 shows the results of an experiment this inventors have made. The graph of the experimental results shows the relation between the S/N ratio of secondary electron detection with respect to the electron beam energy for scanning the reference marks. From the graph, it is seen that the S/N ratio increases with the increase of the electron beam energy. Therefore, when the reference marks are scanned by the electron beam for detection of the positions of the marks, the reference mark detection signals resulting from the scanning the marks by the electron beam can be increased in their intensity by higher energy electron beam.

The reference mark detection signals may be a reflected electron signal in place of the secondary electron signal. The ratio of the reflected electron signal to noise is also increased by the increase of the electron energy for scanning.

Figure 2:
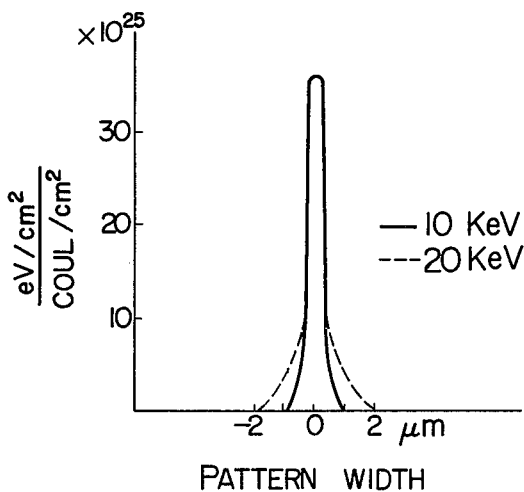
FIG. 2 is a graph of the energy of the electron beam accumulated on the sample vs. the width of drawn pattern.

FIG. 2 shows the results of another experiment this inventors have made. The graph of the results shows the relation between the width of formed pattern and the electron beam energy accumulated upon the resist (emulsion for electron beam) coated on a sample, or wafer. From the graph, it is seen that the broken-line curve of 20 -keV electron beam has a gentle skirt as compared with the solid-line curve of 10-keV electron beam. This means that as the electron beam increases, the pattern width becomes wider and wider thereby lessening high-precision in the pattern. Therefore, lower-energy electron beam scanning on a sample is effective to prevent the widening of the pattern width formed by the scanning.

In accordance with an embodiment of the invention, the accelerating voltage, and hence energy of the electron beam is changed to a higher value upon scanning the reference marks by the electron beam for determining the positions thereof than upon scanning the sample by the electron beam for making a pattern.

Thus, it will be obvious that the embodiment of the invention can prevent widening of the pattern width due to the increase of the reference mark detection signal intensity.

Figure 3:
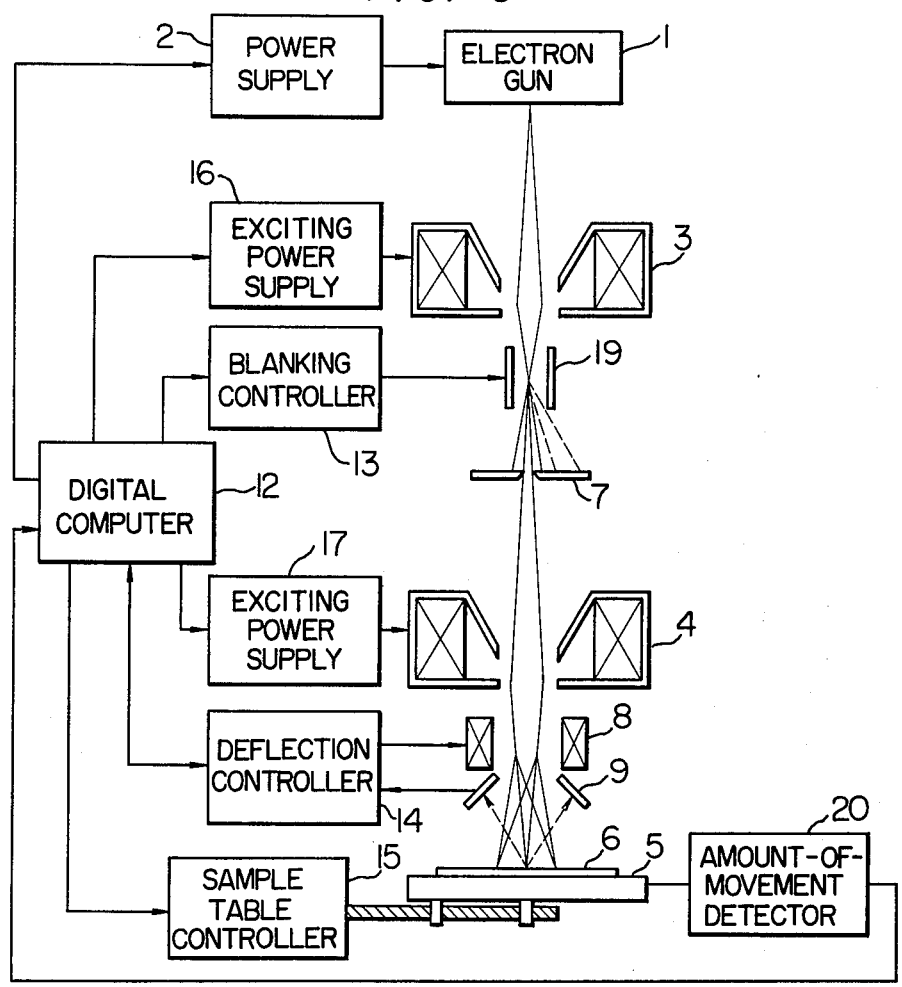
FIG. 3 is a block diagram of an embodiment of the electron beam exposure apparatus of the invention.
Figure 4:
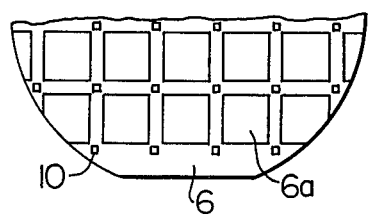
FIG. 4 is a top view of part of the sample table in FIG. 3.

FIG. 3 shows one preferred embodiment of the invention. Referring to FIG. 3, an electron beam emitted from an electron gun 1 is accelerated by an accelerating voltage from a power supply 2. The accelerated electron beam is focussed on a sample 6 on a sample table 5 by focussing lenses 3 and 4, between which a blanking deflection device 19 and a blanking iris 7 are disposed. The electron beam impinges upon the blanking iris 7 when the blanking deflection device 19 is operated, causing the blanking of the beam. Between the focussing lens 4 and the sample 6, there is disposed a deflection device 8 by which the electron beam is deflected in accordance with a pattern signal for a pattern to be formed. Between the deflection device 8 and the sample 6 is disposed a secondary electron detector 9 which detects the secondary electrons from a reference mark 10 formed as shown in FIG. 4.

The data of the pattern to be formed is read from a program stored within digital computer 12 and is used to control a blanking controller 13, a deflection controller 14 and a sample table controller 15. Thus, the electron beam is blanked by the blanking deflection device 19 and deflected by the deflection device 8 in accordance with the pattern to be formed. In addition, the sample table 5 is controlled to move in the X and Y directions. The deflection of the electron beam by the deflection device 8 causes the sample 6 or the reference marks formed thereon to be scanned by the electron beam.

The pattern generation is performed on the basis of the positions of the reference marks 10 formed on the sample 6. In other words, the reference marks 10 formed on the sample 6 are scanned by the electron beam. The electron beam is deflected by the deflection device 8 which is controlled by the deflection controller 14 on the basis of the data read from the digital computer. When the reference marks 10 are scanned by the electron beam, secondary electrons are generated from the reference marks 10 which are detected by the secondary electron detector 9. The detected signals are applied via the deflection controller 14 to the digital computer 12, which then computes the positions of the reference marks 10 on the basis of the secondary electron detection signals.

On the other hand, the amount of the movement of the sample table 5 is detected by an amount-of-movement detector 20 formed with an optical interference meter and the amount of movement is computed by the digital computer 12. The digital computer 12 also computes the deviation between a set value and the measured amount of movement of the sample table 5.

The digital computer 12 controls the deflection controller 14 so as to form a pattern with the deviation of the amount of movement compensated for with reference to the positions of the reference marks 10.

The digital computer 12 controls the acceleration power supply 2 to supply higher energy to the electron beam when the reference marks 10 are scanned than when the sample 6 is scanned by the electron beam. Thus, the accelerating voltage of the electron beam is changed in magnitude in a switching manner to a higher magnitude during scanning of the reference marks 10, so that the reference marks can be detected with high sensitivity to enable high-precision patterning.

Since the conditions at which the electron beam is focussed and deflected are changed by the change of energy of the electron beam, exciting power supplies 16 and 17 for the focussing lenses 3 and 4, in the embodiment of FIG. 3, are controlled by the computer 12 to compensate for the change of the focussing conditions in response to the change of the focussing voltage or energy of electron beam. As described later, the compensation is also made for the change of the deflection condition occuring when the accelerating voltage is changed thus preventing the change of patterning due to the change of accelerating voltage.

Figure 5:
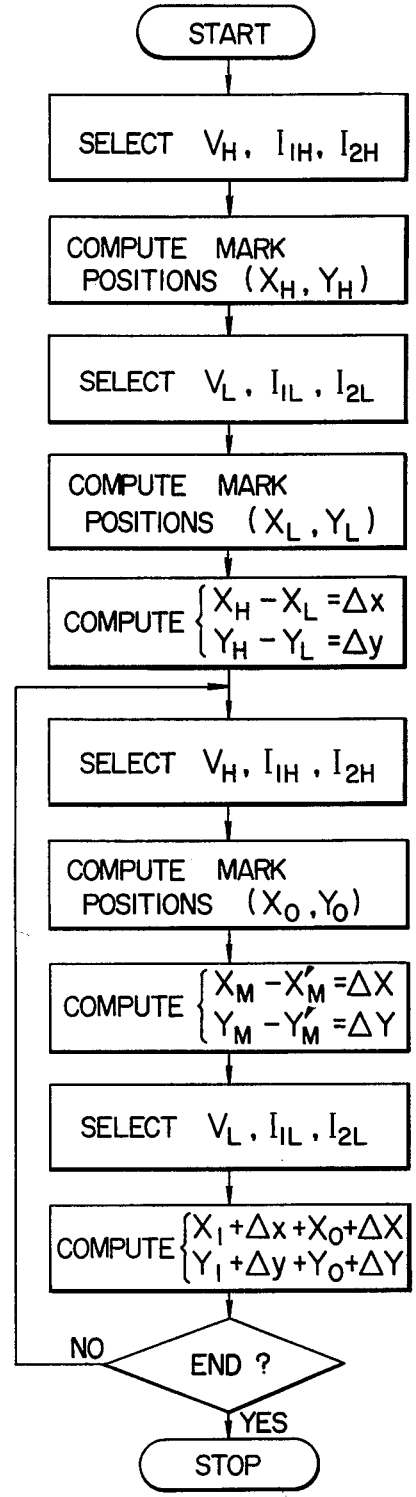
FIG. 5 is a flow chart of the operation of the embodiment.

FIG. 5 shows the flow chart of operations of one embodiment of the invention. The patterning will be described with reference to the flow chart of FIG. 5.

(1) The computer 12 controls the accelerating power supply 2 to supply a high accelerating voltage $V_H$, and controls the exciting power supplies 16 and 17 so that at this accelerating voltage, exciting currents $I_{1H}$ and $I_{2H}$ suitable for focussing the electron beam on the sample 6 flow into the focussing lenses 3 and 4.

(2) The sample table 5 is moved so that an arbitrary one of a plurality of reference marks 10 can be scanned by the electron beam, and the mark is scanned by the electron beam. The secondary electron detection signal is generated from the mark and used for the computation of the coordinates $(X_H, Y_H)$ of the mark.

(3) The accelerating voltage is changed to a low accelerating voltage $V_L$, at which exciting currents $I_{1L}$ and $I_{2L}$ for the focussing lenses 3 and 4 are selected to focus the electron beam on the sample 6. The high accelerating voltage $V_H$ may be 20-keV and the low accelerating voltage be 10-keV.

(4) The coordinates $(X_L, Y_L)$ of the mark which the electron beam scans are computed as in the above description, and also the computation of $X_H - X_L = \Delta x$, and $Y_H - Y_L = \Delta y$ is performed, wherein $\Delta x$ and $\Delta y$ represent the amounts of change of the electron beam deflection caused by the change of the accelerating voltage.

(5) As in the step (1), the high accelerating voltage $V_H$, and the exciting currents $I_{1H}$ and $I_{2H}$ are selected.

(6) The reference mark 10 associated with a given drawing region (exposure region) of a plurality of drawing regions (exposure regions) 6a on the sample 6 is brought to the position which the electron beam scans, by moving the sample table 5. Then, under this condition, the mark coordinates $(X_0, Y_0)$ are computed similarly as in the step (2).

(7) Computation is made of the difference, $X_M - X'_M = \Delta X$, $Y_M - Y'_M = \Delta Y$ between the set values $X_M$, $Y_M$ and the measured values $X'_M$, $Y'_M$, of the amounts of the movement of the sample table 5 at the step (6).

(8) As in the step (3), the low accelerating voltage $V_L$, and exciting currents $I_{1L}$ and $I_{2L}$ are selected.

(9) Under this condition, if the coordinates of a point of a drawing region (exposure region) associated with the coordinates $(X_0, Y_0)$ of the mark is taken as $(X_1, Y_1)$ with respect to the reference coordinates $(X_0, Y_0)$, the computation of $X_1 + \Delta x + X_0 + X$, $Y_1 + \Delta y + Y_0 + \Delta Y$ is performed. These signals are applied as drawing signals (exposure signals) from the computer 12 to the deflection system of the deflection controller 14 and the deflection device 8.

(10) The steps (5) to (9) are repeated until all the drawing regions on the sample 6 are drawn or exposured completely.

Thus, since high accelerating voltage is used upon mark detection and low accelerating voltage upon pattern formation, it is apparent that high sensitivity mark detection is possible and at the same time it is possible to form high precision patterns. In addition, the lens system is excited in response to the change of the accelerating voltage so that the focussing conditions are not changed. Since the $\Delta x$ and $\Delta y$ computed at the step (4) are added to the drawing data $X_1$, $Y_1$ at the step (9), it will be readily understood that compensation is made for the change of the deflection conditions due to the change of the accelerating voltage. Therefore, it is prevented that the patterning is adversely affected by the change of the accelerating voltage.

While in the above embodiment the secondary electron signals are used as mark detection signals, reflected electron signals may be used instead thereof.

In the embodiment, the accelerating power supply 12, exciting power supplies 16 and 17, blanking controller 13, deflection controller 14, sample table controller 15 and detector 20 for the amount of movement of sample table may be conventional devices.

Since in the embodiment of the present invention various changes and modifications can be made by those skilled in the art without departing from the spirit of the invention, it should be understood that the above-described embodiment is useful in the understanding of the invention and is not intended to limit the invention.

We claim:

1. An electron beam exposure apparatus comprising: means for generating an electron beam;
means for scanning a reference mark formed on a sample by said electron beam so as to determine the position of the reference mark, and for scanning said sample so that a predetermined pattern with respect to the position of said reference mark is formed on said sample; and means for changing the energy of said electron beam to a higher value upon scanning of said reference mark than upon scanning said sample.

2. An electron beam exposure apparatus comprising:
means for generating an electron beam;
means for generating a voltage to accelerate said electron beam;
means for scanning a reference mark formed on a sample by said electron beam so as to determine the position of the reference mark and for scanning said sample so that a predetermined pattern is formed on said sample with respect to the position of said reference mark; and
means for changing said accelerating voltage to a higher value upon scanning of said reference mark than upon the scanning of said sample.

3. An electron beam exposure apparatus comprising:
means for generating an electron beam;
means for focussing said electron beam on the sample;
means for scanning a reference mark formed on said sample by said electron beam so as to determine the position of the reference mark and for scanning said sample so that a predetermined pattern is formed on said sample with respect to the position of said reference mark;
means for changing the energy of said electron beam to a higher value upon scanning said reference mark than upon scanning said sample; and
means for controlling said focussing means in response to the change of the energy of said electron beam to substantially focus said electron beam on said sample upon the scanning of said reference mark and upon the scanning of said sample.

4. An electron beam exposure apparatus comprising:
means for generating an electron beam;
means for generating a voltage to accelerate said electron beam;
means for focussing said accelerated electron beam on said sample;
means for scanning a reference mark by said electron beam so as to determine the position of said reference mark formed on said sample and for scanning said sample so that a predetermined pattern with respect to the position of said reference mark is formed on said sample;
means for changing said accelerating voltage to a higher value upon scanning said reference mark than upon scanning said sample;
means for controlling said focussing means in response to the change of the accelerating voltage of said electron beam to substantially focus said electron beam on said sample upon the scanning of said reference mark and upon the scanning of said sample.

5. An electron beam exposure apparatus according to claim 1 or 3, further comprising means for compensating for the difference between the determined positions of said mark before and after the change of the energy of said electron beam.

6. An electron beam exposure apparatus according to claim 2 or 4, further comprising means for compensating for the difference between the determined positions of said mark before and after the change of the accelerating voltage.

7. An electron microscope comprising:
means for generating an electron beam;
means for scanning a reference mark by said electron beam so as to determine the position of the reference mark formed on a sample and for scanning said sample so that a predetermined pattern with respect to the position of said reference mark is formed on said sample; and
means for changing the energy of said electron beam to a first value upon scanning said sample and to a second value larger than said first value upon scanning said reference mark.

8. An electron beam exposure apparatus according to claim 7, further comprising means for computing the difference between coordinates at the determined position of said mark when the energy of said electron beam is changed to said first value, and coordinates at the determined position of said mark when the energy of said electron beam is changed to said second value.

9. An electron beam exposure apparatus comprising:
means for generating an electron beam;
means for selectively generating first and second accelerating voltages for accelerating said electron beam, said first voltage being higher than said second voltage; and
means for scanning a reference mark by said electron beam so as to determine the position of said reference mark formed on a sample and scanning said sample so that a predetermined pattern with respect to the position of said reference mark is formed on said sample;
said accelerating-voltage generating means functioning to generate said first accelerating voltage upon scanning said reference mark and said second accelerating voltage upon scanning said sample.

10. An electron beam exposure apparatus according to claim 9, further comprising means for computing the difference between coordinates at the determined position of said mark when said first accelerating voltage is selected, and coordinates at the determined position of said mark when said second accelerating voltage is selected.

* * * * *